(12) United States Patent
Su et al.

(10) Patent No.: US 11,722,760 B2
(45) Date of Patent: Aug. 8, 2023

(54) IMAGING LENS ASSEMBLY MODULE, IMAGING LENS ASSEMBLY DRIVING MODULE AND ELECTRONIC DEVICE

(71) Applicant: LARGAN DIGITAL CO., LTD., Taichung (TW)

(72) Inventors: Heng-Yi Su, Taichung (TW); Ming-Ta Chou, Taichung (TW); Te-Sheng Tseng, Taichung (TW)

(73) Assignee: LARGAN DIGITAL CO., LTD., Taichung (TW)

( * ) Notice: Subject to any disclaimer, the term of this patent is extended or adjusted under 35 U.S.C. 154(b) by 0 days.

(21) Appl. No.: 17/391,171

(22) Filed: Aug. 2, 2021

(65) Prior Publication Data

US 2022/0060611 A1    Feb. 24, 2022

Related U.S. Application Data

(60) Provisional application No. 63/067,898, filed on Aug. 20, 2020.

(51) Int. Cl.
*H04N 23/55* (2023.01)
*H04N 23/54* (2023.01)
(Continued)

(52) U.S. Cl.
CPC ............. *H04N 23/55* (2023.01); *G01R 33/07* (2013.01); *H04N 23/54* (2023.01); *H05K 1/189* (2013.01);
(Continued)

(58) Field of Classification Search
CPC .... H04N 5/2254; H04N 5/2253; H04N 23/55; H04N 23/54; G01R 33/07; G01R 33/072;
(Continued)

(56) References Cited

U.S. PATENT DOCUMENTS 7,589,920 B2    9/2009  Shin et al.
10,334,146 B2   6/2019  Im et al.
(Continued)

FOREIGN PATENT DOCUMENTS

CN    208337697 U    1/2019
CN    109951623 A    6/2019
(Continued)

*Primary Examiner* — Abdelaaziz Tissire
(74) *Attorney, Agent, or Firm* — McClure, Qualey & Rodack, LLP

(57) ABSTRACT

An imaging lens assembly module includes an imaging lens assembly, a light path folding element, a first lens barrel, a second lens barrel, a base and a plurality of rolling bearings. The imaging lens assembly includes a plurality of plastic lens elements, and defines a first optical axis passing through the plastic lens elements. The first lens barrel contains one or more of the plastic lens elements. The second lens barrel contains another one or more of the plastic lens elements. The base includes a guiding groove structure, and the guiding groove structure extends continuously along a direction parallel to the first optical axis. The rolling bearings interposed between the first lens barrel and the base and the rolling bearings interposed between the second lens barrel and the base are interposed in the guiding groove structure.

18 Claims, 10 Drawing Sheets

(51) Int. Cl.
*G01R 33/07* (2006.01)
*H05K 1/18* (2006.01)
*G02B 1/04* (2006.01)

(52) U.S. Cl.
CPC .... *G02B 1/041* (2013.01); *H05K 2201/10121* (2013.01); *H05K 2201/10151* (2013.01)

(58) Field of Classification Search
CPC ......... H05K 1/189; H05K 2201/10121; H05K 2201/10151; H05K 2201/056; G02B 1/041; G02B 7/04; G02B 7/09; G03B 17/12
See application file for complete search history.

(56) References Cited

U.S. PATENT DOCUMENTS

| | | | |
|---|---|---|---|
| 10,416,473 | B2 | 9/2019 | Lee et al. |
| 10,534,194 | B2 | 1/2020 | Lee et al. |
| 10,594,911 | B2 | 3/2020 | Im et al. |
| 10,678,062 | B2 | 6/2020 | Im et al. |
| 11,159,727 | B2 | 10/2021 | Lee et al. |
| 11,381,803 | B2 | 7/2022 | Lee et al. |
| 2015/0109485 | A1 | 4/2015 | Ozaki et al. |
| 2016/0306168 | A1 | 10/2016 | Singh et al. |
| 2018/0224665 | A1 | 8/2018 | Im et al. |
| 2018/0364450 | A1 | 12/2018 | Lee et al. |
| 2020/0137274 | A1* | 4/2020 | Lee ...................... G02B 27/646 |
| 2020/0348479 | A1* | 11/2020 | Kwon ................... G03B 30/00 |
| 2021/0377450 | A1* | 12/2021 | Shabtay ............... G02B 13/009 |

FOREIGN PATENT DOCUMENTS

| | | |
|---|---|---|
| CN | 209642802 U | 11/2019 |
| CN | 210986196 U | 7/2020 |
| TW | 202111417 A | 3/2021 |
| TW | 202113449 A | 4/2021 |
| WO | 2019110617 A1 | 6/2019 |
| WO | 2019199148 A1 | 10/2019 |

* cited by examiner

IMAGING LENS ASSEMBLY MODULE, IMAGING LENS ASSEMBLY DRIVING MODULE AND ELECTRONIC DEVICE

RELATED APPLICATIONS

This application claims priority to U.S. Provisional Application Ser. No. 63/067,898, filed Aug. 20, 2020, which is herein incorporated by reference.

BACKGROUND

Technical Field

The present disclosure relates to an imaging lens assembly module and an imaging lens assembly driving module. More particularly, the present disclosure relates to an imaging lens assembly module and an imaging lens assembly driving module applicable to portable electronic devices.

Description of Related Art

In recent years, portable electronic devices have developed rapidly. For example, intelligent electronic devices and tablets have been filled in the lives of modern people, and imaging lens assembly modules and imaging lens assembly driving modules mounted on portable electronic devices have also prospered. However, as technology advances, the quality requirements of the imaging lens assembly modules and the imaging lens assembly driving modules are becoming higher and higher. Therefore, developing an imaging lens assembly modules and an imaging lens assembly driving modules which can enhance the imaging quality has become a crucial and urgent issue in the related industries.

SUMMARY

According to one aspect of the present disclosure, an imaging lens assembly module includes an imaging lens assembly, a light path folding element, a first lens barrel, a second lens barrel, a base and a plurality of rolling bearings. The imaging lens assembly includes a plurality of plastic lens elements, and defines a first optical axis passing through the plastic lens elements. The light path folding element is for a light entering thereinto along a second optical axis and folding the light along the first optical axis entering into the imaging lens assembly. The first lens barrel contains one or more of the plastic lens elements. The second lens barrel contains another one or more of the plastic lens elements. The first lens barrel and the second lens barrel are mounted on the base. The plurality of rolling bearings are interposed between the first lens barrel and the base and the second lens barrel and the base, respectively, which is for allowing the first lens barrel and the second lens barrel being relative to the base and displaceable along the first optical axis. The base includes a guiding groove structure facing towards the first lens barrel and the second lens barrel, and the guiding groove structure extends continuously along a direction parallel to the first optical axis. The rolling bearings interposed between the first lens barrel and the base and the rolling bearings interposed between the second lens barrel and the base are interposed in the guiding groove structure.

According to another aspect of the present disclosure, an electronic device includes the imaging lens assembly module according to the aforementioned aspect and an image sensor. The image sensor is for transforming the light passing through the imaging lens assembly to an image signal.

According to another aspect of the present disclosure, an image lens assembly driving module is for driving a plastic lens elements of an imaging lens assembly moving along a first optical axis of the imaging lens assembly and includes a light path folding element, a first lens barrel, a second lens barrel, a coil member, a first magnet and a second magnet. The light path folding element is for a light entering thereinto along a second optical axis and folding the light along the first optical axis entering into the imaging lens assembly. The first lens barrel contains one or more of the plastic lens elements. The second lens barrel contains another one or more of the plastic lens elements. The coil member includes a plurality of coils electrically separated to each other and arranged along a direction parallel to the first optical axis. The first magnet is fixed on the first lens barrel. The second magnet is fixed on the second lens barrel. The first magnet and the second magnet are arranged along the direction parallel to the first optical axis. The coil member corresponds to the first magnet and the second magnet simultaneously.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1A:
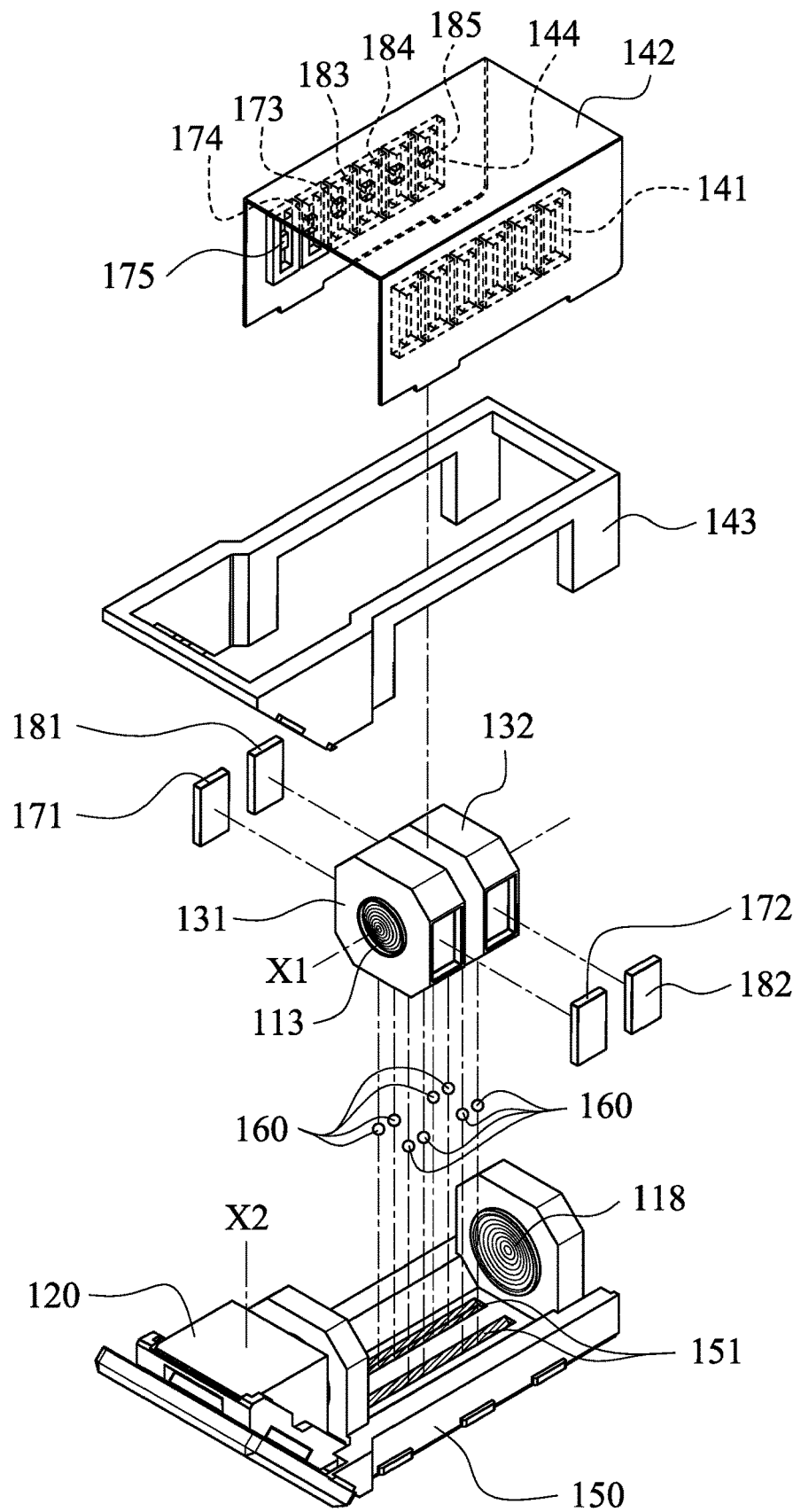
FIG. 1A is an exploded view of an electronic device according to the 1st embodiment of the present disclosure.

An imaging lens assembly module includes an imaging lens assembly, a light path folding element, a first lens barrel, a second lens barrel, a base and a plurality of rolling bearings. The imaging lens assembly includes a plurality of plastic lens elements, and defines a first optical axis passing through the plastic lens elements. The light path folding element is for a light entering thereinto along a second optical axis and folding the light along the first optical axis entering into the imaging lens assembly. The first lens barrel contains one or more of the plastic lens elements. The second lens barrel contains another one or more of the plastic lens elements. The first lens barrel and the second lens barrel are mounted on the base. The rolling bearings are interposed between the first lens barrel and the base and the second lens barrel and the base, respectively, which is for allowing the first lens barrel and the second lens barrel being relative to the base and displaceable along the first optical axis. The base includes a guiding groove structure facing towards the first lens barrel and the second lens barrel, and the guiding groove structure extends continuously along a direction parallel to the first optical axis. The rolling bearings interposed between the first lens barrel and the base and the rolling bearings interposed between the second lens barrel and the base are interposed in the guiding groove structure.

Further, the first lens barrel and the second lens barrel can be plastic lens barrels, the light path folding element can be a mirror or a prism, and the guiding groove structure extends linearly and provides a degree of freedom for the movement of the first lens barrel and the second lens barrel along the first optical axis. Therefore, the possibility of generating a coaxiality deviation and a mechanical assembling tolerance by using different guiding groove structures to the first lens barrel and the second lens barrel can be declined, wherein the accumulation of the value of the coaxiality deviation and the value of the mechanical assembling tolerance will cause the decrease of the imaging quality of the imaging lens assembly module.

The imaging lens assembly module can further include a first magnet pair. The first magnet pair is fixed on the first lens barrel and includes two magnets. The two magnets are disposed opposite to each other about the first optical axis, wherein one of the two magnets of the first magnet pair is a first sensing magnet and is disposed relative to a first Hall sensing element, and the first Hall sensing element is for detecting a displacement of the first lens barrel along the first optical axis. In particular, the two magnets can be a sensing magnet and a driving magnet, respectively. Therefore, the effect of the magnetic field on the first Hall sensing element additionally generated by the coil member during current-carrying can be prevented and can further prevent interpretation distortion of signals.

The imaging lens assembly module can further include a second magnet pair. The second magnet pair is fixed on the second lens barrel and includes two magnets. The two magnets are disposed opposite to each other about the first optical axis, wherein one of the two magnets of the second magnet pair is a second sensing magnet and is disposed relative to a second Hall sensing element, and the second Hall sensing element is for detecting a displacement of the second lens barrel along the first optical axis. By the two detecting mechanisms, the total optical imaging functional time of zooming and focusing of the imaging lens assembly can be shorten. Further, the shorten effect of the optical imaging functional time is much more obviously to a long stroke operating distance optical system. In particular, the term "long stroke" can represent a single lens barrel which operating distance is greater than 0.3 mm to 0.5 mm and less than 9 mm to 12 mm, but the present disclosure is not limited thereto. In the present disclosure, the operating distance of the first lens barrel is 2.5 mm to 6 mm, approximately, and the operating distance of the second lens barrel is 2 mm to 5 mm, approximately.

The imaging lens assembly module can further include a flexible printed circuit board, wherein each of the first Hall sensing element and the second Hall sensing element are welded thereon. The circuit design on the flexible printed circuit board is more flexible since the flexible characteristic of the flexible printed circuit board, which is favorable to minimize the volume of the imaging lens assembly module and reducing the mechanism complexity.

The imaging lens assembly module can further include a third Hall sensing element, wherein the third Hall sensing element is for detecting the displacement of the first lens barrel along the first optical axis. It is favorable for enhancing the detecting accuracy of longer movement distance of the first lens barrel by detecting the displacement of the first lens barrel along the first optical axis by the first Hall sensing element and the third Hall sensing element. For example, the third Hall sensing element can reinforce the first Hall sensing element before the detecting distance become so long that the detecting distance affect the detecting sensitivity of the first Hall sensing element being affected, so as to prevent the detecting sensitivity of the first Hall sensing element from being affected and optimize the efficiency of signal detecting and computation correction.

The first Hall sensing element and the third Hall sensing element can be arranged along a direction parallel to the first optical axis. In detail, the detecting signal intensity of the first Hall sensing element and the detecting signal intensity of the third Hall sensing element are available to find a more accurate position of the first lens barrel by a null detecting analog integrated circuit computing method, wherein the analog integrated circuit computing method can be differential amplifier, positive edge-trigger, negative edge-trigger, etc., but the present disclosure is not limited thereto.

The imaging lens assembly module can further include a fourth Hall sensing element, wherein the fourth Hall sensing element is for detecting the displacement of the second lens barrel along the first optical axis. It is favorable for enhancing the detecting accuracy of longer movement distance of the second lens barrel by detecting the displacement of the second lens barrel along the first optical axis by the second Hall sensing element and the fourth Hall sensing element. For example, the fourth Hall sensing element can reinforce the second Hall sensing element before the detecting distance become so long that the detecting distance affect the detecting sensitivity of the second Hall sensing element, so as to prevent the detecting sensitivity of the second Hall sensing element from being affected and optimize the efficiency of signal detecting and computation correction.

The second Hall sensing element and the fourth Hall sensing element can be arranged along a direction parallel to the first optical axis. By arranging the second Hall sensing element and the fourth Hall sensing element along a direction parallel to the first optical axis, it is favorable for maintaining the analog signals computing efficiency with less deviation, and preventing the deviation of the horizontal reference potential between two signals affecting the interpretation of the position detection.

The imaging lens assembly module can further include a frame element, wherein the frame element is for supporting the flexible printed circuit board and disposed on the base. In particular, the frame element and the base can be made of plastic material. The size accuracy of the frame element and the size accuracy of the base can be individually enhanced by fabricating the frame element and the base separately, and can reduce the defects formed from warpage, severely shrinking, inadequate size accuracy stability of the plastic during injection molding process. Therefore, it is favorable to maintaining the linearity of the guiding groove structure and the higher linearity between the first lens barrel and the second lens barrel.

Each of the aforementioned features of the imaging lens assembly module can be utilized in various combinations for achieving the corresponding effects.

The present disclosure provides an electronic device. The electronic device includes the aforementioned imaging lens assembly module and an image sensor, wherein the image sensor is for transforming the light passing through the imaging lens assembly to an image signal.

The present disclosure provides an image lens assembly driving module, wherein the image lens assembly driving module is for driving plastic lens elements of an imaging lens assembly moving along a first optical axis of the imaging lens assembly, and includes a light path folding element, a first lens barrel, a second lens barrel, a coil member, a first magnet and a second magnet. The light path folding element is for a light entering thereinto along a second optical axis and folding the light along the first optical axis entering into the imaging lens assembly. The first lens barrel contains one or more of the plastic lens elements. The second lens barrel contains another one or more of the plastic lens elements. The coil member includes a plurality of coils electrically separated to each other and arranged along a direction parallel to the first optical axis. The first magnet is fixed on the first lens barrel. The second magnet is fixed on the second lens barrel. The first magnet and the second magnet are arranged along the direction parallel to the first optical axis. The coil member corresponds to the first magnet and the second magnet simultaneously.

Further, the coil member corresponds to the first magnet and the second magnet simultaneously, and the coils of the coil member provide current separately and electromagnetic interact correspondingly with the first magnet and the second magnet to generate the driving force. The first lens barrel and the second lens barrel can be pushed and move forward along the first optical axis through the driving force.

The coil member can further include a flexible printed circuit board, wherein each of the coils is welded on the flexible printed circuit board. In particular, the coil member can be the electrically separated coils welded on a flexible printed circuit board and connected to each other separately on the flexible printed circuit board.

The image lens assembly driving module can further include a first sensing element and a second sensing element, wherein the first sensing element and the second sensing element are for detecting the displacement of the first lens barrel along the first optical axis and the displacement of the second lens barrel along first optical axis, respectively, and the first sensing element and the second sensing element are welded on the flexible printed circuit board individually. Therefore, the assembling speed of the first sensing element and a second sensing element can be increased so as to enhance the fabricating speed.

The coil member and the first sensing element can be disposed opposite to each other relative to the first optical axis. Therefore, the effect of the magnetic field on the first sensing element additionally generated by the coil member during current-carrying can be prevented and can further prevent interpretation distortion of signals. Further, the usage efficiency of the flexible printed circuit board can be enhanced so as to prevent the excessive height of the image lens assembly driving module and obtain the compact size thereof.

The coil member and the second sensing element can be disposed opposite to each other relative to the first optical axis. Therefore, the effect of the magnetic field on the second sensing element additionally generated by the coil member during current-carrying can be prevented and can further prevent interpretation distortion of signals. Further, the usage efficiency of the flexible printed circuit board can be enhanced so as to prevent the excessive height of the image lens assembly driving module and obtain the compact size thereof.

The first sensing element and the second sensing element can be arranged along the direction parallel to the first optical axis. Therefore, the mechanism design of the first lens barrel and the mechanism design of the second lens barrel can be simplified so as to reduce the complexity of the injection molding process, and enhance the molding quality of the first lens barrel and the molding quality of the second lens barrel, which is favorable to enhance the fabricating speed.

The image lens assembly driving module can further include a third sensing element and the fourth sensing element, wherein the third sensing element and the fourth sensing element are used for detecting the displacement of the first lens barrel along the first optical axis and the displacement of the second lens barrel along the first optical axis, respectively. In detail, a more accurate position of the first lens barrel and a more accurate position of the second lens barrel can be found by the detecting signal intensity of the third sensing element and the detecting signal intensity of the fourth sensing element are available to find which can use a null detecting analog integrated circuit computing method, wherein the analog integrated circuit computing method can be differential amplifier, positive edge-trigger, negative edge-trigger, etc., but the present disclosure is not limited thereto. Therefore, more parameter sources for the follow-up compensation and optimization to the position detecting deviation of the image lens assembly driving module can be provided.

When a specific axial distance kept between the first sensing element and the third sensing element along the first optical axis is d1, the following condition can be satisfied: 0.2 mm<d1<8 mm. Further, the following condition can be satisfied: 0.7 mm<d1<6 mm. When a specific axial distance kept between the second sensing element and the fourth sensing element along the first optical axis is d2, the following condition can be satisfied: 0.2 mm<d2<8 mm. Further, the following condition can be satisfied: 0.7 mm<d2<6 mm. Hence, the sensitivity of the position detecting can be maintained by keeping specific value in the ranges of d1 and d2. When the values of d1 and d2 are too small, the two signals will be so similar that the result of the analog computing shows less reference value. When the values of d1 and d2 are too large, the window period of signals is so long that the accuracy of the detected position is easier to fluctuate.

Each of the aforementioned features of the image lens assembly driving module can be utilized in various combinations for achieving the corresponding effects.

According to the aspects mentioned above, the following are the embodiments and will be detail described with the corresponding figures.

1st Embodiment

Please refer to FIG. 1A to FIG. 1D. FIG. 1A to FIG. 1D are exploded views of an electronic device 10 according to the 1st embodiment of the present disclosure at different angles. According to FIG. 1A to FIG. 1D, the electronic device 10 includes an imaging lens assembly module (its reference numeral is omitted) and an image sensor 193

(shown in FIG. 1E), wherein the image sensor 193 is for transforming a light passing through the imaging lens assembly to an image signal.

Further, the imaging lens assembly module includes an image lens assembly driving module (its reference numeral is omitted), an imaging lens assembly (its reference numeral is omitted), a base 150 and a plurality of rolling bearings 160.

The image lens assembly driving module is for driving plastic lens elements 111 (shown in FIG. 1E), 112, 113, 114 (shown in FIG. 1E), 115 (shown in FIG. 1E), 116 (shown in FIG. 1E), 117, 118, 119 of the imaging lens assembly moving along a first optical axis X1 of the imaging lens assembly, and includes a light path folding element 120, a first lens barrel 131, a second lens barrel 132, a coil member (its reference numeral is omitted), a first magnet 172, a second magnet 182, a first sensing element 173 and a second sensing element 183.

Figure 1B:
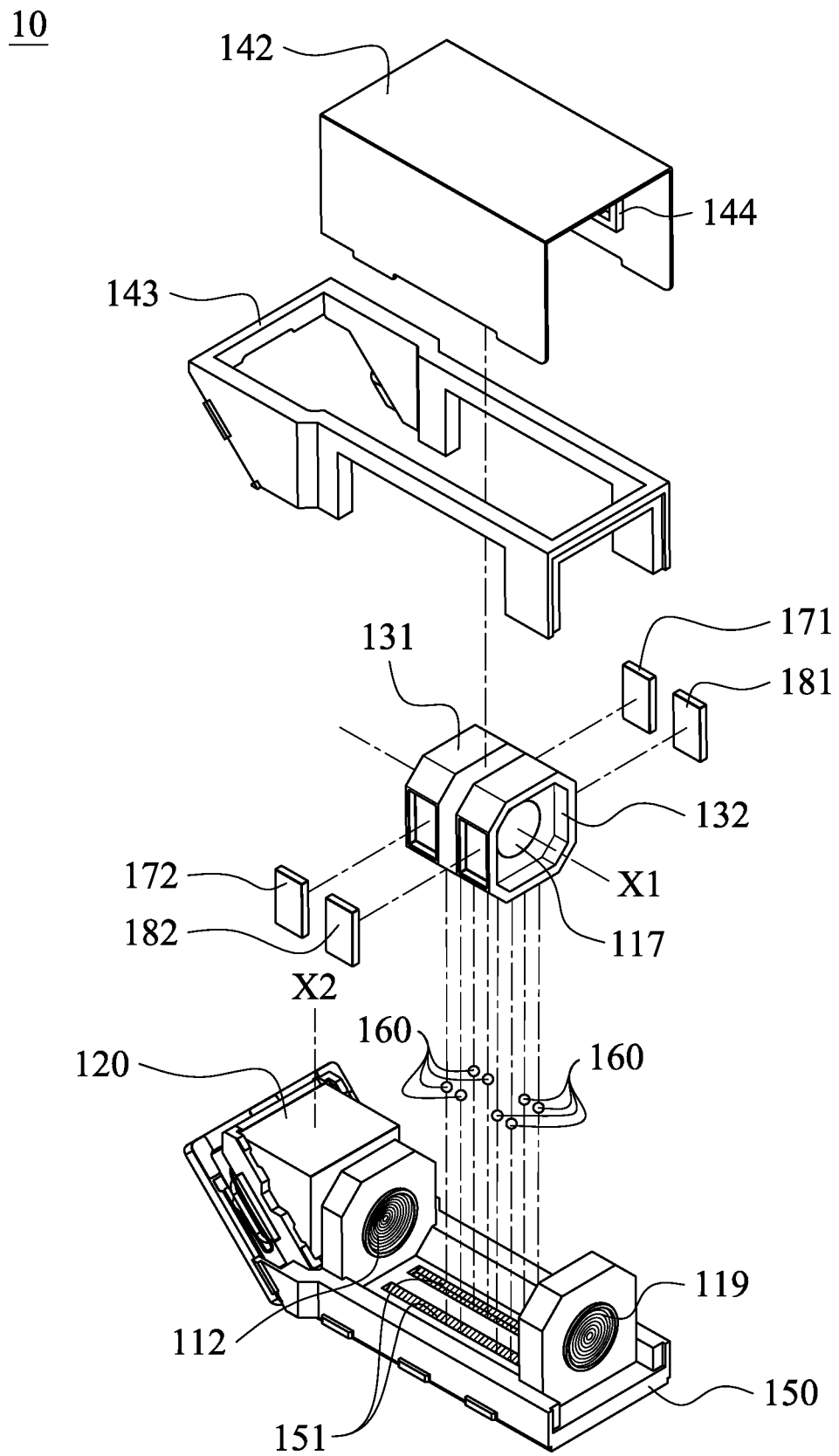
FIG. 1B is another exploded view of an electronic device according to the 1st embodiment of FIG. 1A.
Figure 1C:
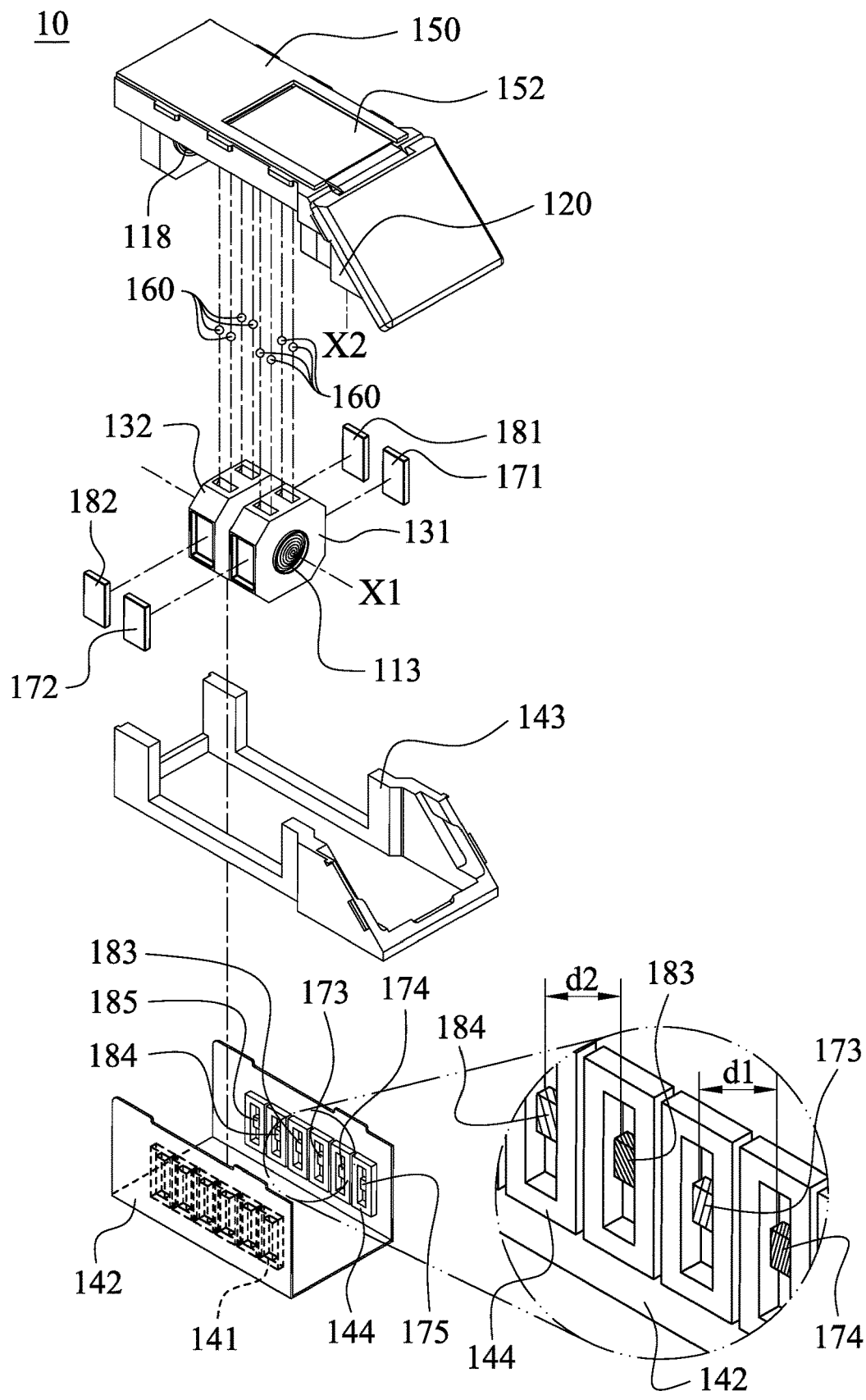
FIG. 1C is further another exploded view of an electronic device according to the 1st embodiment of FIG. 1A.
Figure 1D:
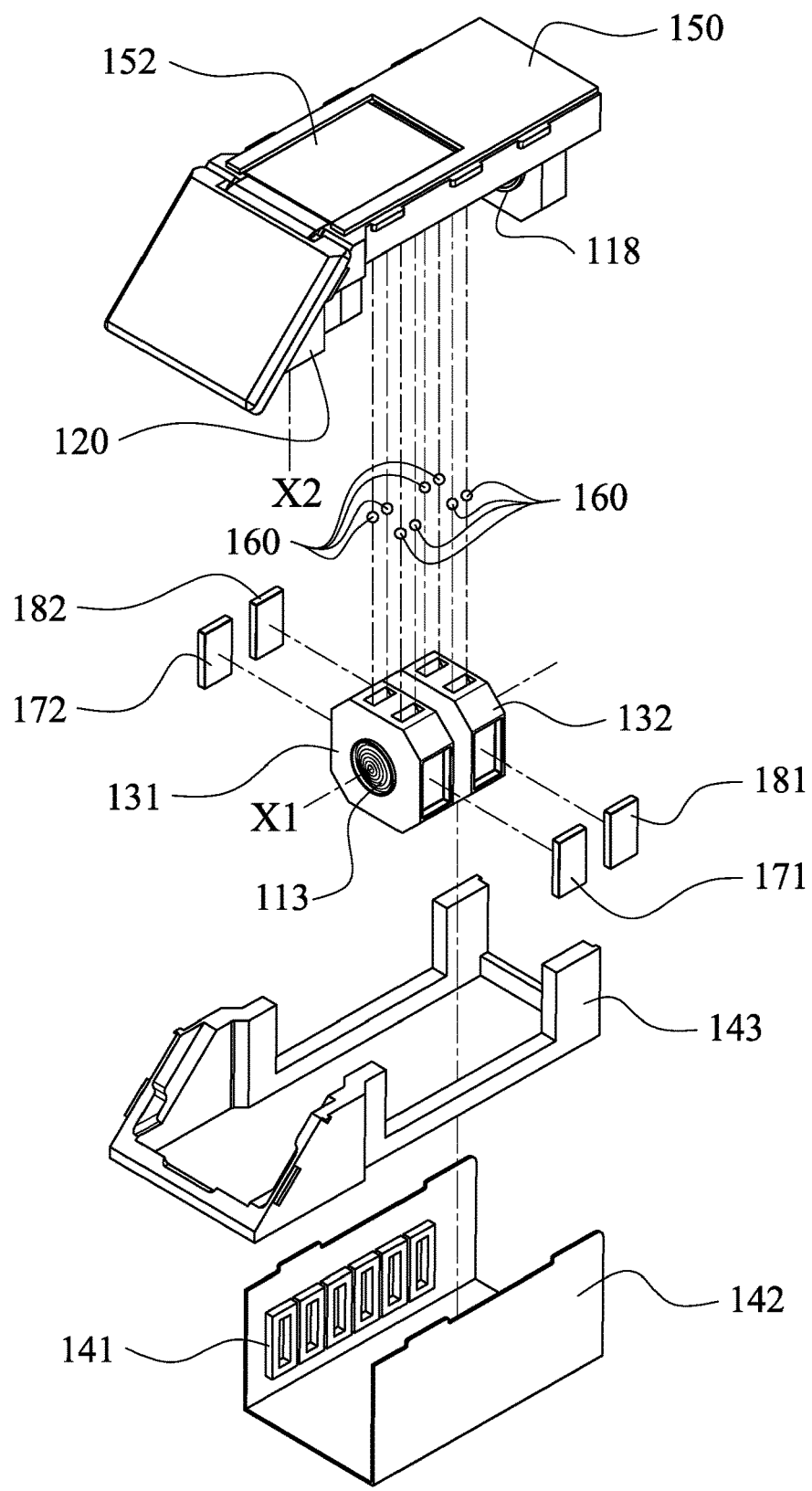
FIG. 1D is another exploded view of an electronic device according to the 1st embodiment of FIG. 1A.
Figure 1E:
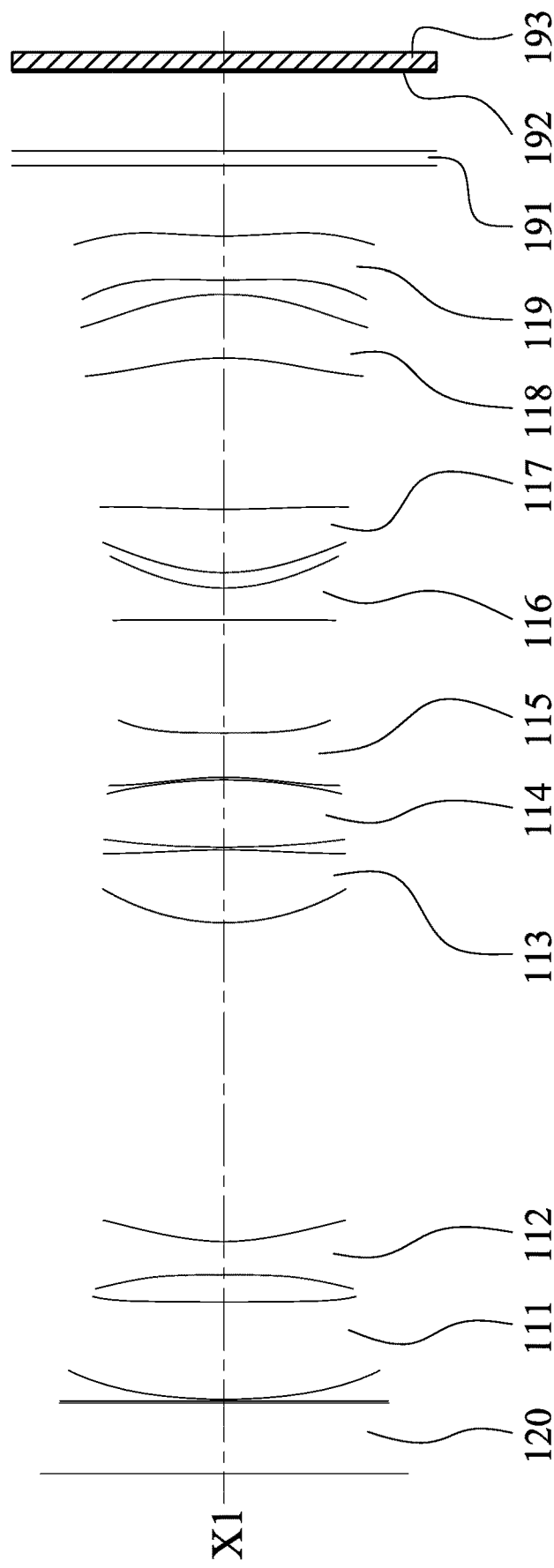
FIG. 1E is an optical surface schematic view of an imaging lens assembly according to the 1st embodiment of FIG. 1A.

Please also refer to FIG. 1E. FIG. 1E is an optical surface schematic view of an imaging lens assembly according to the 1st embodiment of FIG. 1A. According to FIG. 1E, the imaging lens assembly includes the plastic lens elements 111, 112, 113, 114, 115, 116, 117, 118, 119 and a filter 191, and can define the first optical axis X1 passing through the plastic lens elements 111, 112, 113, 114, 115, 116, 117, 118, 119, wherein the image sensor 193 is disposed at an image surface 192 of the imaging lens assembly, and the filter 191 is disposed between the plastic lens element 119 and the imaging surface 192. It should be mentioned that the optical characteristics of the plastic lens elements, such as quantity, structure, and shape, can be set as different imaging requirements, and can further dispose other optical elements on demand, the present disclosure is not limited thereto.

In particular, the plastic lens element 111 is located at the object side, and the plastic lens element 119 is located at the most image side, wherein the light path folding element 120 is located at the object side of the plastic lens element 111, and the light path folding element 120 is for a light entering thereinto along a second optical axis X2 and folding the light along the first optical axis X1 entering into the imaging lens assembly. Further, the light path folding element 120 can be a mirror or a prism.

The first lens barrel 131 contains one or more of the plastic lens elements 111, 112, 113, 114, 115, 116, 117, 118, 119, and the second lens barrel 132 contains another one or more of the plastic lens elements 111, 112, 113, 114, 115, 116, 117, 118, 119. In the 1st embodiment, the first lens barrel 131 and the second lens barrel 132 can be a plastic lens barrel, the first lens barrel 131 contains the plastic lens elements 113, 114, 115, and the second lens barrel 132 contains the plastic lens elements 116, 117, but the present disclosure is not limited thereto.

The first lens barrel 131 and the second lens barrel 132 are mounted on the base 150, and the base 150 includes a guiding groove structure 151, wherein the guiding groove structure 151 faces towards the first lens barrel 131 and the second lens barrel 132, and the guiding groove structure 151 extends continuously along a direction parallel to the first optical axis X1.

The rolling bearings 160 are interposed between the first lens barrel 131 and the base 150 and the second lens barrel 132 and the base 150, respectively, which is for allowing the first lens barrel 131 and the second lens barrel 132 being relative to the base 150 and displaceable along the first optical axis X1, wherein the rolling bearings 160 interposed between the first lens barrel 131 and the base 150 and the rolling bearings 160 interposed between the second lens barrel 132 and the base 150 are interposed in the guiding groove structure 151. In the 1st embodiment, the number of the rolling bearings 160 is eight, but the present disclosure is not limited thereto.

In detail, in the 1st embodiment, the guiding groove structure 151 of the base 150 extends in stripe-shaped and provides a degree of freedom to the movement of the first lens barrel 131 and the second lens barrel 132 along the first optical axis X1. Therefore, the possibility of bringing about a coaxiality deviation and a mechanical assembly tolerance by using different guiding groove structures to the first lens barrel 131 and the second lens barrel 132 can be declined, wherein the accumulating value of the coaxiality deviation and the mechanical assembly can cause imaging quality loss to the imaging lens assembly module.

The imaging lens assembly module can further include a first magnet pair (its reference numeral is omitted). The first magnet pair is fixed on the first lens barrel 131 and includes two magnets. The two magnets are disposed opposite to each other about the first optical axis X1, wherein one of the two magnets of the first magnet pair is a first sensing magnet 171 and the other one is the first magnet 172, and the first sensing magnet 171 and the first magnet 172 are fixed on the first lens barrel 131. The first sensing magnet 171 is disposed relative to the first sensing element 173, and the first sensing element 173 is for detecting a displacement of the first lens barrel 131 along the first optical axis X1. In particular, the first sensing magnet 171 is for sensing the displacement of the first lens barrel 131, and the first magnet 172 is for driving the first lens barrel 131. Therefore, the effect of the magnetic field on the first sensing element 173 additionally generated by the coil member during current-carrying can be prevented and can further prevent interpretation distortion of signals.

The imaging lens assembly module can further include a second magnet pair (its reference numeral is omitted). The second magnet pair is fixed on the second lens barrel 132 and includes two magnets. The two magnets are disposed opposite to each other about the first optical axis X1, wherein one of the two magnets of the second magnet pair is a second sensing magnet 181 and the other one is the second magnet 182, and the second sensing magnet 181 and the second magnet 182 are fixed on the second lens barrel 132. The second sensing magnet 181 is disposed relative to the second sensing element 183, and the second sensing element 183 is for detecting a displacement of the second lens barrel 132 along the first optical axis X1. In particular, the second sensing magnet 181 is for sensing the displacement of the second lens barrel 132, and the second magnet 182 is for driving the second lens barrel 132. By the two detecting mechanisms, the total optical imaging functional time of zooming and focusing of the imaging lens assembly can be shorten. Further, the shorten effect of the optical imaging functional time is much more obviously to a long stroke operating distance optical system.

In particular, the term "long stroke" can represent a single lens barrel which operating distance is greater than 0.3 mm to 0.5 mm and less than 9 mm to 12 mm, but the present disclosure is not limited thereto. In the 1st embodiment, the operating distance of the first lens barrel 131 is 2.5 mm to 6 mm, approximately, and the operating distance of the second lens barrel 132 is 2 mm to 5 mm, approximately.

The coil member includes a plurality of coils 141. The coils 141 are electrically separated to each other and arranged along a direction parallel to the first optical axis X1. Further, the first magnet 172 and the second magnet 182 are arranged along the direction parallel to the first optical axis X1, and the coil member corresponds to the first magnet 172 and the second magnet 182 simultaneously. In particular, the coils 141 of the coil member provide current separately and electromagnetic interact correspondingly with the first magnet 172 and the second magnet 182 to generate the driving force. The first lens barrel 131 and the second lens barrel 132 can be pushed and move forward along the first optical axis X1 through the driving force.

The coil member can further include a flexible printed circuit board 142, each of the coils 141 is welded on the flexible printed circuit board 142, and each of the first sensing element 173 and the second sensing element 183 are welded on the flexible printed circuit board 142. The circuit design on the flexible printed circuit board 142 is more flexible since the flexible characteristic of the flexible printed circuit board 142, which is favorable for minimizing the volume of the imaging lens assembly module and reducing the mechanism complexity. In particular, the coil member can be the electrically separated coils 141 welded on a flexible printed circuit board 142 and connected to each other separately on the flexible printed circuit board 142. Therefore, the assembling speed of the first sensing element 173 and the second sensing element 183 can be increased so as to enhance the fabricating speed.

The coil member and the first sensing element 173 are disposed opposite to each other relative to the first optical axis X1, and the coil member and the second sensing element 183 are disposed opposite to each other relative to the first optical axis X1. Therefore, the effect of the magnetic field on the first sensing element 173 and the second sensing element 183 additionally generated by the coil member during current-carrying can be prevented and can further prevent interpretation distortion of signals. Further, the usage efficiency of the flexible printed circuit board 142 can be enhanced so as to prevent the excessive height of the image lens assembly driving module and achieve the compact size thereof.

The first sensing element 173 and the second sensing element 183 are arranged along the direction parallel to the first optical axis X1. Therefore, the mechanism design of the first lens barrel 131 and the mechanism design of the second lens barrel 132 can be simplified so as to reduce the complexity of the injection molding process, and enhance the molding quality of the first lens barrel 131 and the molding quality of the second lens barrel 132, which is favorable to enhance the fabricating speed.

According to FIG. 1A to FIG. 1C, the image lens assembly driving module can further include a third sensing element 174 and a fourth sensing element 184, wherein the third sensing element 174 and the fourth sensing element 184 are used for detecting the displacement of the first lens barrel 131 along the first optical axis X1 and the displacement of the second lens barrel 132 along the first optical axis X1, respectively, and the first sensing element 173, the second sensing element 183, the third sensing element 174 and the fourth sensing element 184 are arranged along the direction parallel to first optical axis X1. In detail, a more accurate position of the first lens barrel 131 and the second lens barrel 132 can be found by the detecting signal intensity of the first sensing element 173, the detecting signal intensity of the second sensing element 183, the detecting signal intensity of the third sensing element 174 and the detecting signal intensity of the fourth sensing element 184 which can use a null detecting analog integrated circuit computing method, wherein the analog integrated circuit computing method can be differential amplifier, positive edge-trigger, negative edge-trigger, etc., but the present disclosure is not limited thereto. Therefore, more parameter sources for the follow-up compensation and optimization to the position detecting deviation of the image lens assembly driving module can be provided. Further, by arranging the first sensing element 173, the detecting signal intensity of the second sensing element 183, the detecting signal intensity of the third sensing element 174 along the direction parallel to first optical axis X1, can maintain the analog signals computing efficiency with less deviation, and can prevent the deviation of the horizontal reference potential between two signals affecting the interpretation of the position detection.

Further, the displacement of the first lens barrel 131 along the first optical axis X1 can be detected by the first sensing element 173 and third sensing element 174, so that the detecting accuracy of longer movement distance thereof can be enhanced. For example, the third sensing element 174 can reinforce the first sensing element 173 before the detecting distance become so long that the detecting sensitivity of the first sensing element 173 being affected, so as to prevent the detecting sensitivity of the first sensing element 173 from being affected and optimize the efficiency of signal detecting and computation correction.

Further, the displacement of the second lens barrel 132 along the first optical axis X1 can be detected by the second sensing element 183 and fourth sensing element 184, so that the detecting accuracy of longer movement distance thereof can be enhanced. For example, the fourth sensing element 184 can reinforce the second sensing element 183 before the detecting distance become so long that the detecting sensitivity of the second sensing element 183 being affected, so as to prevent the detecting sensitivity of the second sensing element 183 from being affected and optimize the efficiency of signal detecting and computation correction.

It is worth to be mentioned that the first sensing element 173 can be a first Hall sensing element, the second sensing element 183 can be a second Hall sensing element, the third sensing element 174 can be a third Hall sensing element, and the fourth sensing element 184 can be a fourth Hall sensing element, but the present disclosure is not limited thereto. The number of the sensing elements (in the 1st embodiment, the sensing elements are the first sensing element 173, the second sensing element 183, the third sensing element 174, the fourth sensing element 184, a fifth sensing element 175 and a sixth sensing element 185) can be adjusted so as to adapt the operating distance of the first lens barrel 131 and the operating distance of the second lens barrel 132. The number of the sensing elements can be decrease when the operating distances are shorter. The number of the sensing elements can be increase when the operating distances are longer.

The imaging lens assembly module can further include a frame element 143, which is for supporting the flexible printed circuit board 142 and disposed on the base 150, wherein the frame element 143 and the base 150 can be made of plastic material. The size accuracy of the frame element 143 and the size accuracy of the base 150 can be individually enhanced by fabricating the frame element 143 and the base 150 separately, and can reduce the defects formed from warpage, severely shrinking, inadequate size accuracy stability of the plastic during injection molding process. Therefore, it is favorable to maintaining the alignment of the guiding groove structure 151 and the higher alignment between the first lens barrel 131 and the second lens barrel 132.

According to FIG. 1A to FIG. 1C, the image lens assembly driving module can further include an auxiliary coil element 144, wherein the auxiliary coil element 144 and the coil member are disposed opposite to each other relative to the first optical axis X1. In particular, the auxiliary coil element 144 can provide additional driving force and allowance for disposing and designing to the image lens assembly driving module, the first sensing element 173, the second sensing element 183, the third sensing element 174, the fourth sensing element 184, the fifth sensing element 175 and the sixth sensing element 185 can be disposed opposite to the coils 141 correspondingly relative to the first optical axis X1, respectively.

According to FIG. 1C and FIG. 1D, the base 150 can further include a ferromagnetic plate 152, wherein the ferromagnetic plate 152 corresponds to the first sensing magnet 171 and the first magnet 172 of the first magnet pair, and the second sensing magnet 181 and the second magnet 182 of the second magnet pair correspond to the ferromagnetic plate 152.

Two of the rolling bearings 160 are disposed between the second sensing magnet 181 and the second magnet 182 of the second magnet pair and along the circumference surrounding the first optical axis X1.

According to FIG. 1C, when a specific axial distance kept between the first sensing element 173 and the third sensing element 174 along the first optical axis X1 is d1, and a specific axial distance kept between the second sensing element 183 and the fourth sensing element 184 along the first optical axis X1 is d2, the mentioned parameters satisfy the following conditions shown in Table 1.

TABLE 1

| d1 (mm) | 1.4 |
|---|---|
| d2 (mm) | 1.4 |

2nd Embodiment

Figure 2A:
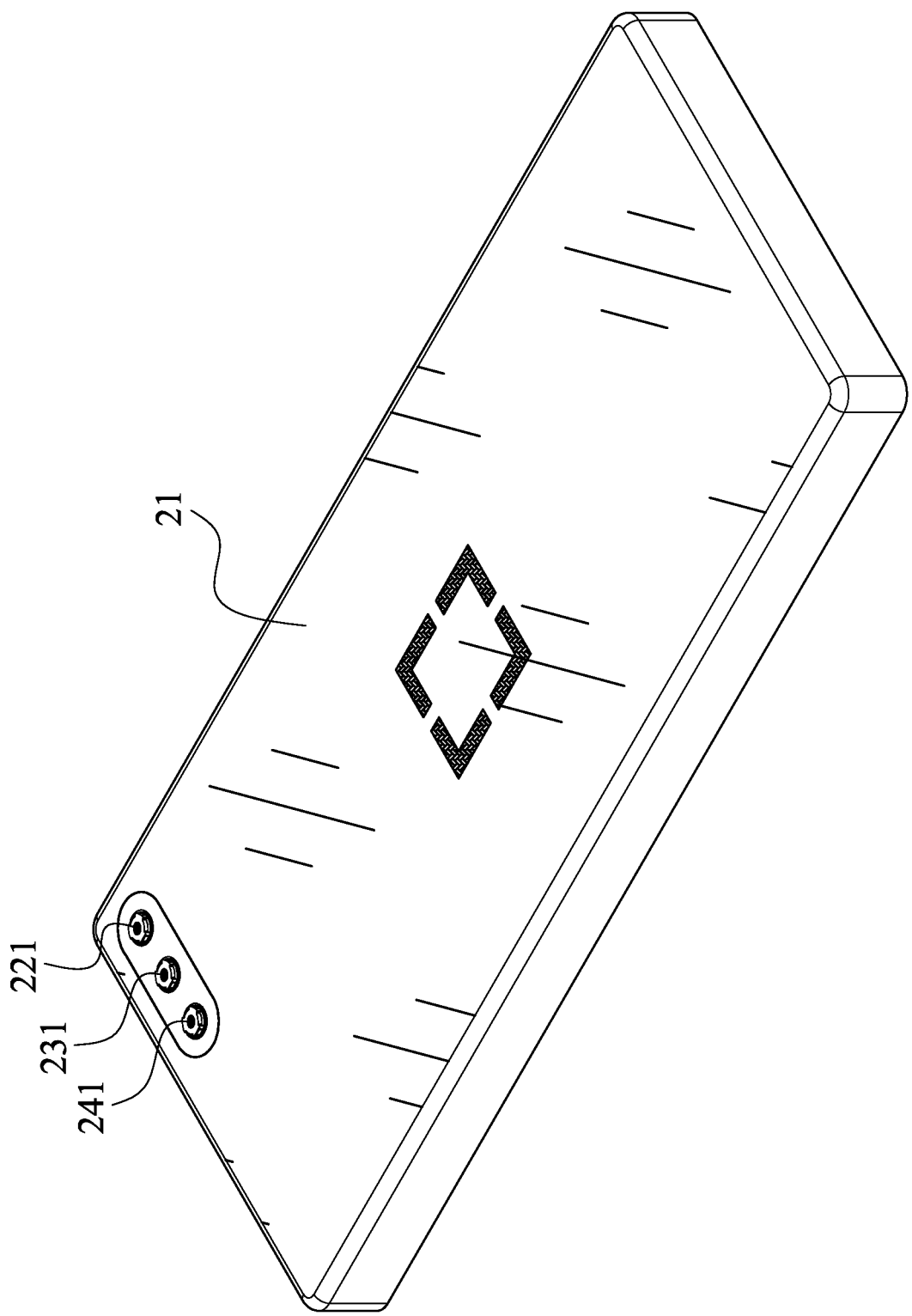
FIG. 2A is a schematic view of an electronic device according to the 2nd embodiment of the present disclosure.
Figure 2B:
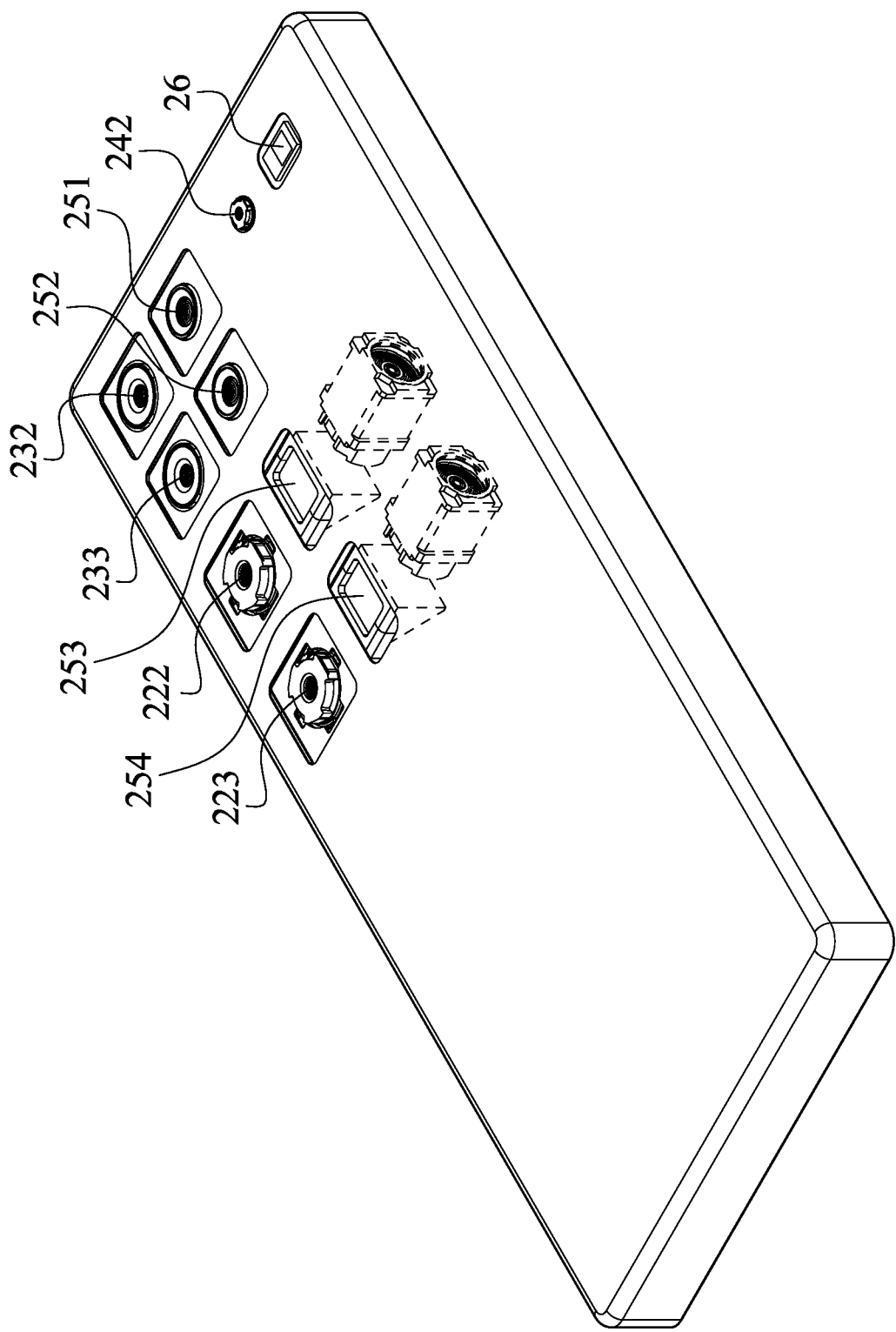
FIG. 2B is another schematic view of an electronic device according to the 2nd embodiment of FIG. 2A.

Please refer to FIG. 2A and FIG. 2B. FIG. 2A is a schematic view of an electronic device 20 according to the 2nd embodiment of the present disclosure. FIG. 2B is another schematic view of the electronic device 20 according to the 2nd embodiment of FIG. 2A. According to FIG. 2A and FIG. 2B, the electronic device 20 is a smartphone, and the electronic device 20 includes an imaging lens assembly module, an image sensor (not shown), a plurality of imaging capturing devices, and a display device 21, wherein the image sensor is for transforming the light passing through the imaging lens assembly to an image signal.

In the 2nd embodiment, the imaging lens assembly module includes telephoto image capturing devices 253, 254, and the imaging capturing devices are wide-angle image capturing devices 221, 222, 223, ultra-wide angle image capturing devices 231, 232, 233, TOF (Time-Of-Flight) modules 241, 242 and telephoto image capturing devices 251, 252. The TOF modules can be replaced by other type of image capturing devices, which is not limited thereto. In particular, the imaging lens assembly module can be the imaging lens assembly module mentioned in 1st embodiment, and the telephoto image capturing devices 253, 254 are used for folding the light, but the present disclosure is not limited thereto.

In detail, in the 2nd embodiment, the wide-angle image capturing device 221, the ultra-wide angle image capturing device 231 and the TOF module 241 are disposed at the front side of the electronic device 20, and the wide-angle image capturing devices 222, 223, the ultra-wide angle image capturing devices 232, 233, and the TOF module 242 are disposed at the rear side of the electronic device 20.

The display device 21 can be a touchscreen, which is used for display pictures and having function of touch, and can be used to adjusting shooting angle manually to switch among the wide-angle image capturing devices 221, 222, 223, the ultra-wide angle image capturing devices 231, 232, 233 and the telephoto image capturing devices 251, 252, 253, 254. At this time, an imaging lens assembly (not shown) of the imaging lens assembly module can gather the light to the image sensor and output an image signal to an image signal processor (ISP) (not shown).

The electronic device 20 can further include an optical image stabilization component (not shown) depends on the specification of the electronic device 20. Further, the electronic device 20 can further include at least one focus assisting module (not shown) and at least one sensing element (not shown). The focus assisting module can be a flash module 26 for compensating a color temperature, an infrared distance measurement component, a laser focus module, etc. The sensing element can have functions for sensing physical momentum and kinetic energy, such as accelerator, gyroscope, Hall effect element, to sense shaking or jitters applied by hands of the user or external environments. Accordingly, the electronic device 20 equipped with an auto-focusing mechanism and the optical anti-shake mechanism can be enhanced to achieve the superior image quality. Furthermore, the electronic device 20 according to the present disclosure can have a capturing function with multiple modes, such as taking optimized selfies, high dynamic range (HDR) under a low light condition, 4K resolution recording, etc. Furthermore, the users can visually see a captured image of the camera through the display device 21 and manually operate the view finding range on the display device 21 to achieve the autofocus function of what you see is what you get.

Further, the imaging lens assembly module, the image sensor, the optical image stabilization component, the sensing element and the focus assisting module can be disposed on a flexible printed circuit board (its reference numeral is omitted), and is electrically connected to the related elements such as the image signal processor by a connector (not shown). Since the current electronic devices, such as smart phones, have a tendency of being compact, the way of firstly disposing the imaging lens driving module and related components on the flexible printed circuit board and secondly integrating the circuit thereof into the main board of the electronic device via the connector can satisfy the requirements of the mechanical design and the circuit layout of the limited space inside the electronic device, and obtain more margins. The autofocus function of the imaging lens driving module can also be controlled more flexibly via the touch screen of the electronic device. In the 2nd embodiment, the electronic device 20 can include a plurality of sensing elements and a plurality of focus assisting modules, wherein the sensing elements and the focus assisting modules are disposed on one flexible printed circuit board and at least another one flexible printed circuit board (not shown), and are electrically connected to the related elements such as the image signal processor by corresponding connectors to carry out the shooting process. In other embodiments (not shown), the sensing element and the focus assisting module can be disposed on the motherboard of the electronic device or other type of loading boards depending on the requirements of mechanism design and current arrangement.

Moreover, the electronic device 20 can further include, but not be limited to, a display, a control unit, a storage unit, a random access memory (RAM), a read-only memory (ROM), or the combination thereof.

Figure 2C:
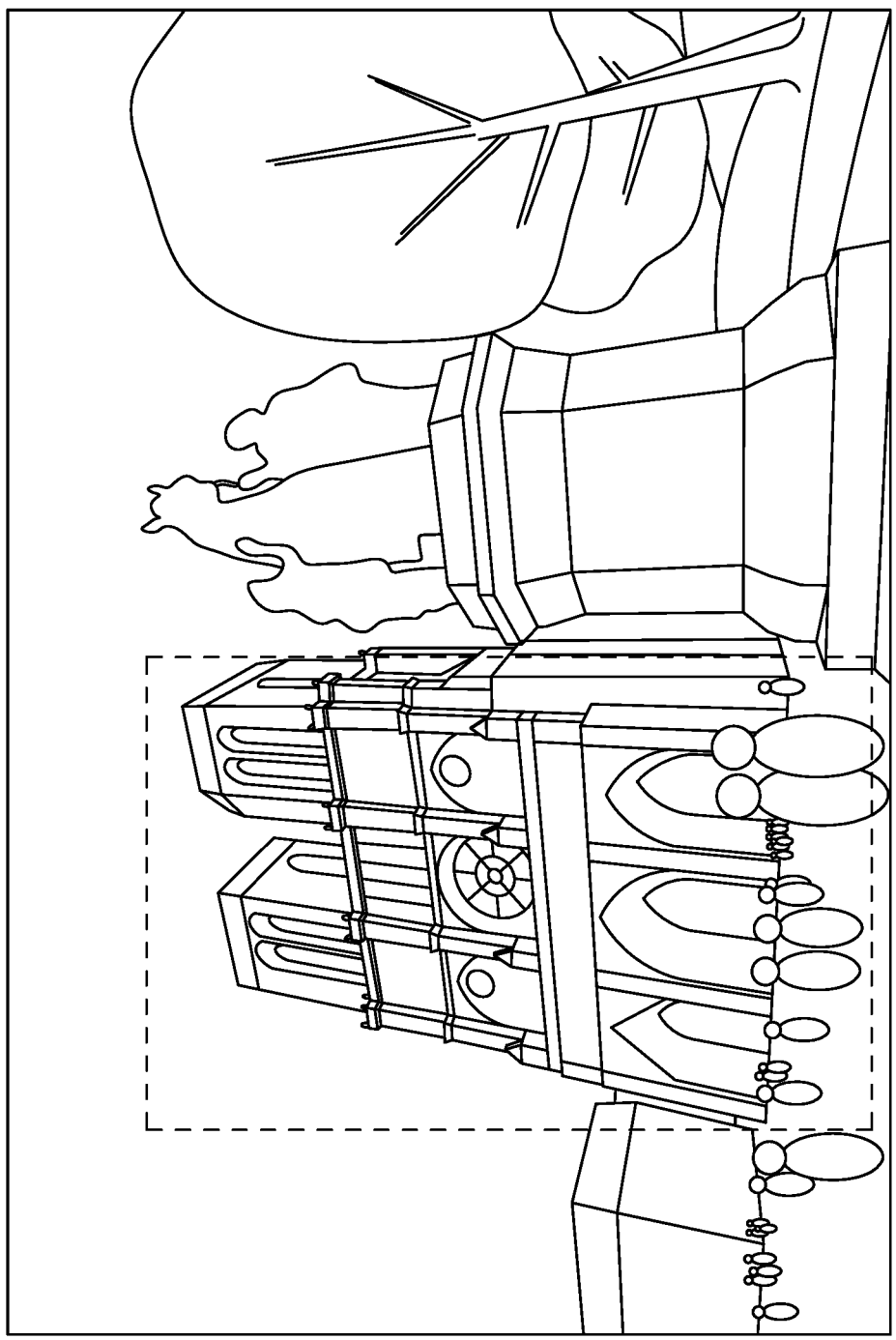
FIG. 2C is a schematic view of an image taken by a plurality of ultra-wide angle image capturing devices according to the 2nd embodiment of FIG. 2A.

Please refer to FIG. 2C. FIG. 2C is a schematic view of an image taken by the ultra-wide angle image capturing devices 231, 232, 233 according to the 2nd embodiment of FIG. 2A. According to FIG. 2C, the ultra-wide angle image capturing device 231, 232, 233 can take a picture with large range, and the ultra-wide angle image capturing device 231, 232, 233 have the function of containing more views in one picture.

Figure 2D:
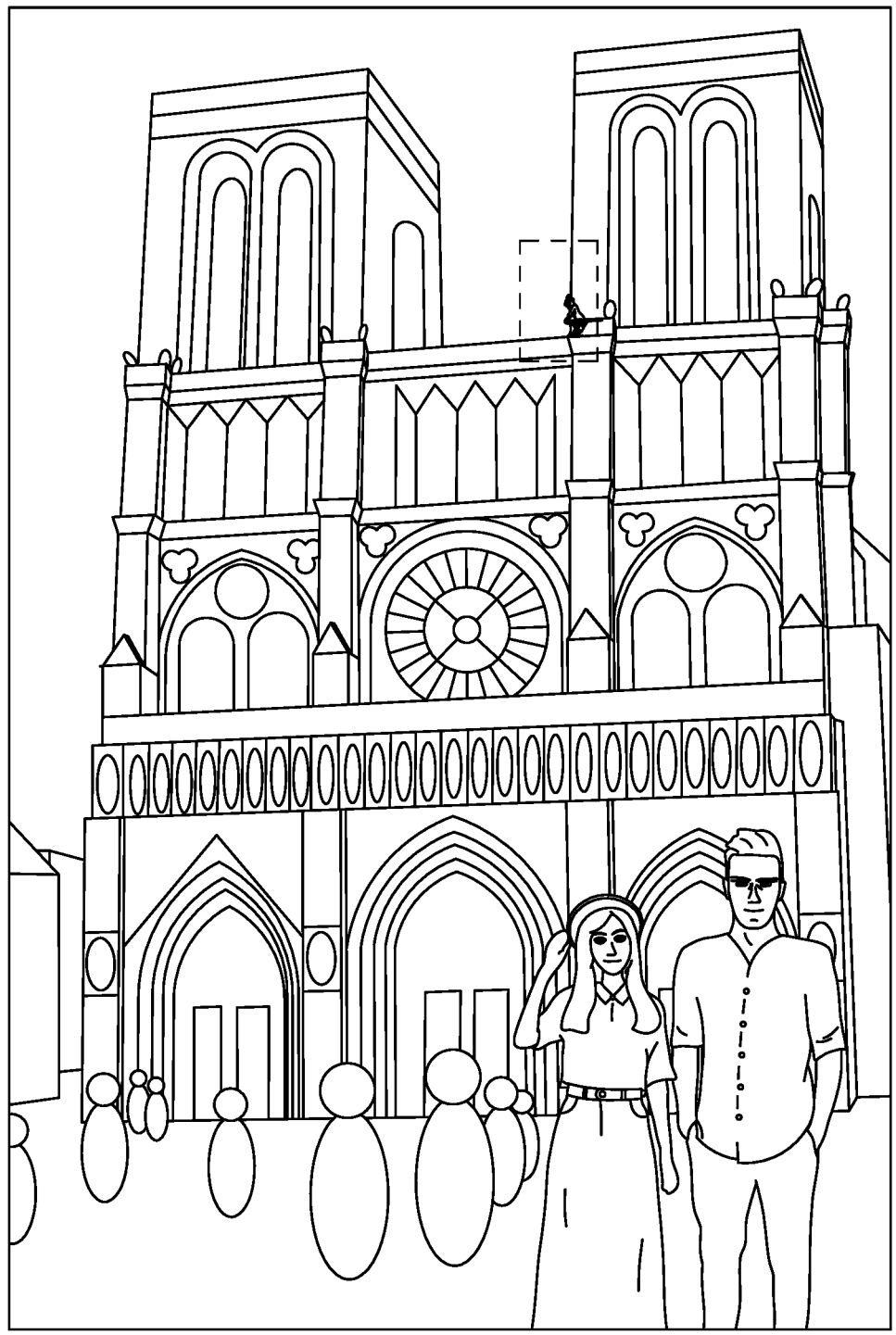
FIG. 2D is a schematic view of an image taken by a plurality of wide angle image capturing devices according to the 2nd embodiment of FIG. 2A.

Please refer to FIG. 2D. FIG. 2D is a schematic view of an image taken by the wide-angle image capturing devices 221, 222, 223 according to the 2nd embodiment of FIG. 2A. According to FIG. 2D, the wide-angle image capturing devices 221, 222, 223 can take a picture with certain range with high resolution, and the wide angle image capturing devices 221, 222, 223 have the function of high resolution and low deformation.

Figure 2E:
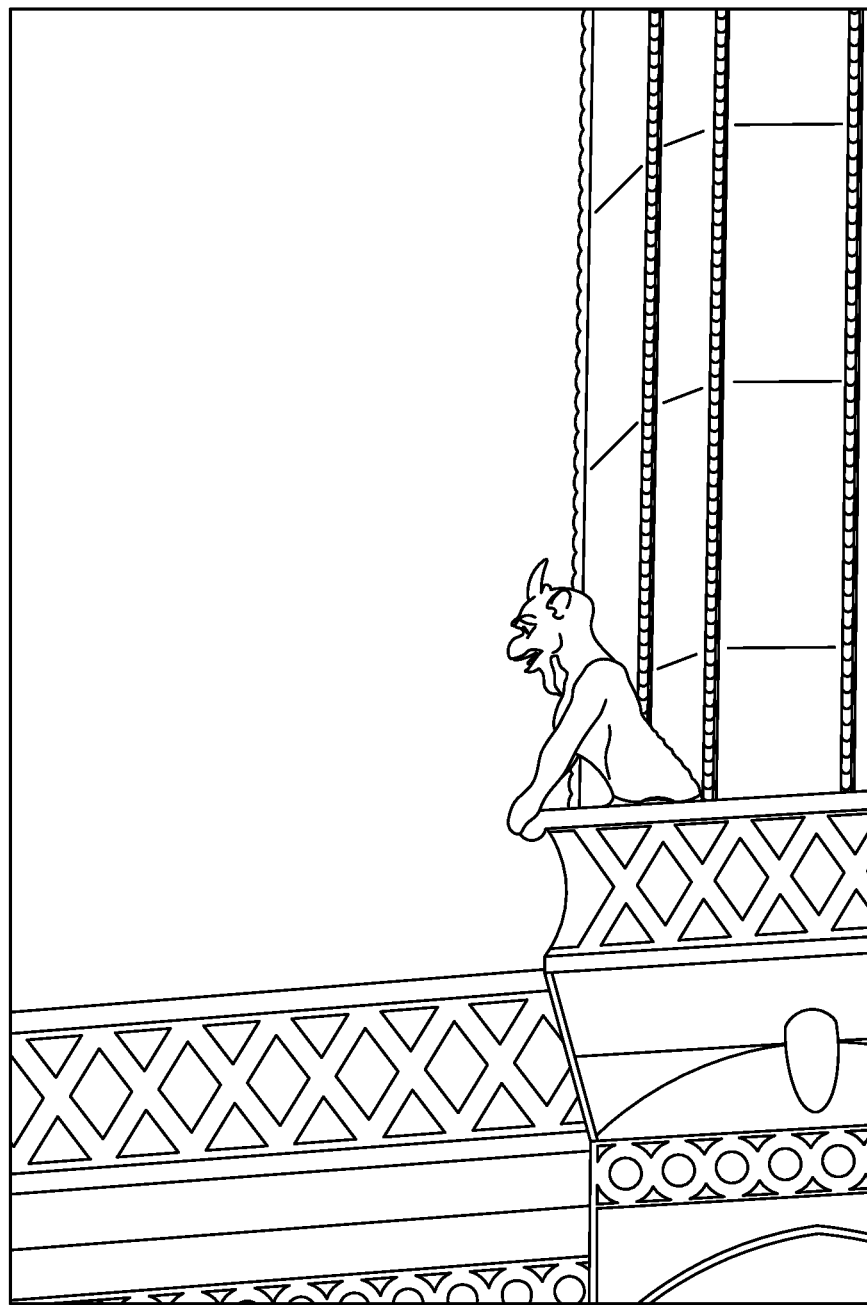
FIG. 2E is a schematic view of an image taken by a plurality of telephoto image capturing devices according to the 2nd embodiment of FIG. 2A.

Please refer to FIG. 2E. FIG. 2E is a schematic view of an image taken by the telephoto image capturing devices 251, 252, 253, 254 according to the 2nd embodiment of FIG. 2A. According to FIG. 2E, the telephoto image capturing devices 251, 252, 253, 254 have a function of zooming in with high magnification and can shoot a picture of the object fay away and zoom into a high magnification.

According to FIG. 2C to FIG. 2E, taking pictures by the imaging lens assembly modules with different focal length and imaging capturing devices, and collocating with the technique of image processing, the electronic device 20 can attain the function of zooming.

The foregoing description, for purpose of explanation, has been described with reference to specific examples. It is to be noted that Tables show different data of the different examples; however, the data of the different examples are obtained from experiments. The examples were chosen and described in order to best explain the principles of the disclosure and its practical applications, to thereby enable others skilled in the art to best utilize the disclosure and various examples with various modifications as are suited to the particular use contemplated. The examples depicted above and the appended drawings are exemplary and are not intended to be exhaustive or to limit the scope of the present disclosure to the precise forms disclosed. Many modifications and variations are possible in view of the above teachings.

What is claimed is:

1. An imaging lens assembly module, comprising:
   an imaging lens assembly comprising a plurality of plastic lens elements, and defining a first optical axis passing through the plastic lens elements;
   a light path folding element for a light entering thereinto along a second optical axis and folding the light along the first optical axis entering into the imaging lens assembly;
   a first lens barrel containing one or more of the plastic lens elements;
   a second lens barrel containing another one or more of the plastic lens elements;
   a base, the first lens barrel and the second lens barrel mounted thereon;
   a plurality of rolling bearings interposed between the first lens barrel and the base and the second lens barrel and the base, respectively, which is for allowing the first lens barrel and the second lens barrel being relative to the base and displaceable along the first optical axis;
   a first magnet pair fixed on the first lens barrel and comprising two magnets disposed opposite to each other about the first optical axis, wherein one of the two magnets of the first magnet pair is a first sensing magnet and is disposed relative to a first Hall sensing element, and the first Hall sensing element is for detecting a displacement of the first lens barrel along the first optical axis; and
   a coil member, wherein the first sensing magnet does not face the coil member;
   wherein the base comprises a guiding groove structure facing towards the first lens barrel and the second lens barrel, and the guiding groove structure extends along a direction parallel to the first optical axis;
   wherein the rolling bearings interposed between the first lens barrel and the base and the rolling bearings interposed between the second lens barrel and the base are interposed in the guiding groove structure.

2. The imaging lens assembly module of claim 1, further comprising:
   a second magnet pair fixed on the second lens barrel and comprising two magnets disposed opposite to each other about the first optical axis, wherein one of the two magnets of the second magnet pair is a second sensing magnet and is disposed relative to a second Hall sensing element, which is for detecting a displacement of the second lens barrel along the first optical axis.

3. The imaging lens assembly module of claim 2, further comprising:
   a flexible printed circuit board, each of the first Hall sensing element and the second Hall sensing element welded thereon.

4. The imaging lens assembly module of claim 3, further comprising:
   a frame element for supporting the flexible printed circuit board and disposed on the base.

5. The imaging lens assembly module of claim 2, further comprising:
   a third Hall sensing element for detecting the displacement of the first lens barrel along the first optical axis.

6. The imaging lens assembly module of claim 5, wherein the first Hall sensing element and the third Hall sensing element are arranged along the direction parallel to the first optical axis.

7. The imaging lens assembly module of claim 2, further comprising:
   a fourth Hall sensing element for detecting the displacement of the second lens barrel along the first optical axis.

8. The imaging lens assembly module of claim 7, wherein the second Hall sensing element and the fourth Hall sensing element are arranged along the direction parallel to the first optical axis.

9. An electronic device, comprising:
   the imaging lens assembly module of claim 1; and
   an image sensor for transforming the light passing through the imaging lens assembly to an image signal.

10. An image lens assembly driving module for driving plastic lens elements of an imaging lens assembly moving along a first optical axis of the imaging lens assembly, comprising:
   a light path folding element for a light entering thereinto along a second optical axis and folding the light along the first optical axis entering into the imaging lens assembly;
   a first lens barrel containing one or more of the plastic lens elements;
   a second lens barrel containing another one or more of the plastic lens elements;

a coil member comprising a plurality of coils electrically separated to each other and arranged along a direction parallel to the first optical axis;

a first magnet fixed on the first lens barrel;

a first sensing magnet fixed on the first lens barrel and disposed opposite to the first magnet about the first optical axis, wherein the first sensing magnet is disposed relative to a first Hall sensing element, and the first Hall sensing element is for detecting a displacement of the first lens barrel along the first optical axis; and a second magnet fixed on the second lens barrel;

wherein the first magnet and the second magnet are arranged along the direction parallel to the first optical axis;

wherein the coil member corresponds to the first magnet and the second magnet simultaneously;

wherein the first sensing magnet does not face the coil member.

11. The image lens assembly driving module of claim 10, wherein the coil member further comprises a flexible printed circuit board, and each of the coils is welded on the flexible printed circuit board.

12. The image lens assembly driving module of claim 11, further comprising:

a first sensing element; and a second sensing element;

wherein the first sensing element and the second sensing element are for detecting a displacement of the first lens barrel along the first optical axis and a displacement of the second lens barrel along first optical axis, respectively, and the first sensing element and the second sensing element are welded on the flexible printed circuit board individually.

13. The image lens assembly driving module of claim 12, wherein the coil member and the first sensing element are disposed opposite to each other relative to the first optical axis.

14. The image lens assembly driving module of claim 12, wherein the coil member and the second sensing element are disposed opposite to each other relative to the first optical axis.

15. The image lens assembly driving module of claim 12, wherein the first sensing element and the second sensing element are arranged along the direction parallel to the first optical axis.

16. The image lens assembly driving module of claim 12, further comprising:

a third sensing element; and a fourth sensing element;

wherein the third sensing element and the fourth sensing element are used for detecting the displacement of the first lens barrel along the first optical axis and the displacement of the second lens barrel along the first optical axis, respectively.

17. The image lens assembly driving module of claim 16, wherein a specific axial distance kept between the first sensing element and the third sensing element along the first optical axis is d1, and the following condition is satisfied:

$0.2 \text{ mm} < d1 < 8 \text{ mm}.$

18. The image lens assembly driving module of claim 16, wherein a specific axial distance kept between the second sensing element and the fourth sensing element along the first optical axis is d2, and the following condition is satisfied:

$0.2 \text{ mm} < d2 < 8 \text{ mm}.$

* * * * *